(12) United States Patent
Kim et al.

(10) Patent No.: US 11,404,604 B2
(45) Date of Patent: Aug. 2, 2022

(54) PIXEL OF MICRO DISPLAY HAVING VERTICALLY STACKED SUB-PIXELS AND COMMON ELECTRODE

(71) Applicant: SUNDIODE KOREA, Seoul (KR)

(72) Inventors: James Chinmo Kim, Mountain View, CA (US); Sungsoo Yi, Sunnyvale, CA (US)

(73) Assignee: SUNDIODE KOREA

( * ) Notice: Subject to any disclaimer, the term of this patent is extended or adjusted under 35 U.S.C. 154(b) by 50 days.

(21) Appl. No.: 17/115,789

(22) Filed: Dec. 8, 2020

(65) Prior Publication Data
US 2021/0184076 A1 Jun. 17, 2021

(30) Foreign Application Priority Data
Dec. 11, 2019 (KR) .................. 10-2019-0164263

(51) Int. Cl.
H01L 33/14 (2010.01)
H01L 33/04 (2010.01)
H01L 33/32 (2010.01)
H01L 33/38 (2010.01)

(52) U.S. Cl.
CPC ............ H01L 33/145 (2013.01); H01L 33/04 (2013.01); H01L 33/325 (2013.01); H01L 33/38 (2013.01)

(58) Field of Classification Search
CPC ..... H01L 33/145; H01L 33/04; H01L 33/325; H01L 33/38
See application file for complete search history.

(56) References Cited

U.S. PATENT DOCUMENTS

| | | | |
|---|---|---|---|
| 2005/0067627 A1* | 3/2005 | Shen | H01L 33/08 257/89 |
| 2008/0251799 A1* | 10/2008 | Ikezawa | H01L 25/0756 257/89 |
| 2014/0284633 A1* | 9/2014 | Tsay | H01L 25/0756 257/88 |
| 2016/0359143 A1* | 12/2016 | Osawa | H01L 51/5278 |
| 2019/0097088 A1* | 3/2019 | Huppmann | H01L 33/0093 |
| 2019/0189596 A1* | 6/2019 | Chae | H01L 33/08 |
| 2019/0189681 A1* | 6/2019 | Chae | H01L 25/0753 |
| 2019/0206927 A1* | 7/2019 | Lee | H01L 27/153 |

* cited by examiner

*Primary Examiner* — Mark W Tornow
(74) *Attorney, Agent, or Firm* — Renaissance IP Law Group LLP

(57) ABSTRACT

Disclosed is a unit pixel of a microdisplay. In the unit pixel, sub-pixels which respectively form blue, green, and red light are vertically stacked on a growth substrate. Accordingly, the overall area of the unit pixel is reduced, and a transfer process is easily performed.

24 Claims, 3 Drawing Sheets

PIXEL OF MICRO DISPLAY HAVING VERTICALLY STACKED SUB-PIXELS AND COMMON ELECTRODE

CROSS-REFERENCE TO RELATED APPLICATION

This application claims priority to and the benefit of Korean Patent Application No. 10-2019-0164263, filed on Dec. 11, 2019, the disclosure of which is incorporated herein by reference in its entirety.

BACKGROUND

1. Field of the Invention

The present invention relates to a structure of a pixel of a microdisplay, and more specifically, to a structure in which sub-pixels are vertically stacked in one pixel.

2. Discussion of Related Art

Microdisplays are next-generation display devices that are being actively developed by many display manufactures. In a microdisplay, each pixel is composed of sub-pixels, and each of the sub-pixels forms red, green, or blue light. The sub-pixel that intrinsically forms light of an intrinsic color has a structure of a light-emitting diode (LED). That is, there is an advantage in that an illuminant emits light of an intrinsic color and thus a backlight is not required, when compared to a conventional display such as that of a liquid-crystal display (LCD). In addition, an LED constituting the sub-pixel is made of an inorganic material and thus has very high reliability and stability. Furthermore, it is known that very clear images may be obtained with less power consumption compared to a display made of organic light-emitting diodes (OLEDs), It is also possible to manufacture displays of various shapes and forms, and it is very advantageous to use LEDs for reducing thickness of displays because LEDs that are manufactured using a conventional metalorganic chemical vapor deposition (MOCVD) process are composed of very thin layers.

Further, in order for one pixel to realize full color in a microdisplay, sub-pixels need to be disposed on a substrate with proper spacing between one another, and at least three sub-pixels need to be coplanar.

A conventional method in which one pixel is configured by placing three coplanar sub-pixels is a technique being used in LCDs, OLEDs, and the like. Furthermore, the method is expected to be applied to the fabrication of microdisplays. However, there are several problems in applying the conventional pixel formation method to microdisplays, which are very large obstacles for implementing the microdisplays.

First, there is a problem in that, a structure used in the conventional pixel formation technique, is very disadvantageous for transfer processing. A compound semiconductor formed on a growth substrate is divided into chips through a singulation process, and the individual chips need be transferred onto a display substrate. Therefore, a pick-and-place process is essential in manufacturing a micro display. The above processes are collectively referred to as a transfer process. In order to form one pixel with the conventional pixel-formation technique, a transfer process needs to be performed three times. That is, a red LED, a green LED, and a blue LED need to be individually transferred onto the display substrate. Doing that is a very heavy burden in that a sub-pixel needs to have a size of about 10 µm, it is not easy to move and place a micron-sized illuminant to a specific position on a display substrate, and a transfer process needs to be repeatedly performed three times per pixel.

Second, there is the problem of a black matrix. A black matrix is used in conventional LCDs, etc. and is used to prevent color interference between sub-pixels each of which realizes a color. For the same purpose, the black matrix also needs to be used in sub-pixels of a microdisplay. In particular, the sub-pixel is composed of an LED, and the active layer of the LED which is usually a multi-quantum well structure where light is formed emits much of the light laterally due to emission characteristics of the semiconductor material used. Therefore, when a black matrix is not used, a desired color cannot be realized due to very severe light interference. Therefore, it is essential to introduce the black matrix to prevent light interference between sub-pixels. However, as described above, in the LED which is a sub-pixel, much of the light formed in the active layer is emitted laterally due to the emission characteristics of the semiconductor material used. Blue LEDs have a strong tendency to emit light in a direction perpendicular to a c-axis direction which is perpendicular to the surface of a display. The above phenomenon is caused by intrinsic characteristics of an LED. In addition, such characteristic of lateral light emission is very strong compared to other displays such as LCDs or OLEDs. Therefore, in order to avoid light interference between adjacent sub-pixels, the thick black matrix needs to be formed, and the thick matrix may be achieved by increasing space between the sub-pixels. When space between the sub-pixels increases, the overall size of the pixel increases, and thus the increased size of the pixel causes decreased resolution in a display.

Third, there is a problem of repairability.

Unlike other devices in which some defects can be tolerated, the display is unique in that, even a single defect occurring in only one pixel of an entire display renders the entire display defective. That is, a problem occurs where other normal pixels cannot be used in the display due to a defect occurring in one pixel among millions. Since a process of transferring sub-pixels is widely used in microdisplays, it is possible to replace defective pixels. The replacement of defective pixels is known as a repair process. A repair process may be performed using various processes and may be performed when an error occurs in contacts between the substrate and the sub-pixels or in the arrangement of the sub-pixels after the sub-pixels have been transferred onto a display substrate. That is, in order to remove an error in the arrangement of the sub-pixels, the corresponding sub-pixel and sub-pixels in the neighboring region may be selectively removed from the display substrate and a new set of sub-pixels be disposed. However, in a structure in which red, green, and blue sub-pixels are horizontally arranged, it is very difficult to select and precisely remove a defective sub-pixel and to newly arrange and place a new sub-pixel. In order to solve the above problem, it is possible to think of a process of removal in blocks and transferring new blocks in, but picking and placing in units of blocks is also not easy. The above problem is caused by the intrinsic characteristics of the transfer process. On a blank display substrate on which no other sub-pixels have been disposed, sub-pixels may be transferred relatively easily, but it is not easy to arrange new sub-pixels between different types of sub-pixels that are already disposed.

Therefore, a pixel structure in which small-sized pixels are easily implemented without having to arrange sub-pixels in the same plane to achieve high resolution and in which a transfer process can be easily implemented is urgently required.

SUMMARY OF THE INVENTION

The present invention is aimed at providing a structure of a pixel of a microdisplay having vertically stacked sub-pixels.

According to an aspect of the present invention, a unit pixel of a microdisplay includes a first sub-pixel formed on a growth substrate and configured to form light having a first wavelength according to a first current, a first current blocking layer formed on the first sub-pixel and configured to block a leakage current directed toward the first sub-pixel or introduced from the first sub-pixel, a second sub-pixel formed on the first current blocking layer and configured to form light having a second wavelength longer than the first wavelength according to a second current, a second current blocking layer formed on the second sub-pixel and configured to block a leakage current directed toward the second sub-pixel or introduced from the second sub-pixel, and a third sub-pixel formed on the second current blocking layer and configured to form light having a third wavelength longer than the second wavelength according to a third current. A common anode is commonly connected to the first sub-pixel, the second sub-pixel, and the third sub-pixel, a first cathode is connected to the first sub-pixel, a second cathode is connected to the second sub-pixel, and a third cathode is connected to the third sub-pixel.

According to another aspect of the present invention, a unit pixel of a microdisplay includes a first sub-pixel formed on a growth substrate and configured to form light having a first wavelength according to a first current, a first current blocking layer formed on the first sub-pixel and configured to block a leakage current directed toward the first sub-pixel or introduced from the first sub-pixel, a second sub-pixel formed on the first current blocking layer and configured to form light having a second wavelength longer than the first wavelength according to a second current, and a third sub-pixel formed on the second sub-pixel and configured to form light having a third wavelength longer than the second wavelength according to a third current. A common cathode is commonly connected to the first sub-pixel, the second sub-pixel, and the third sub-pixel, a first anode is connected to the first sub-pixel, a second anode is connected to the second sub-pixel, and a third anode is connected to the third sub-pixel.

According to the present invention described above, sub-pixels forming lights having different wavelengths are vertically formed on a growth substrate. Therefore, the overall area of a pixel of a microdisplay can be reduced. That is, compared to a pixel conventionally formed by a combination of red, green, and blue sub-pixels arranged horizontally on a display substrate, the area of a unit pixel can be significantly reduced.

Further, in order to manufacture a microdisplay, a pick-and-place process is required. The pick-and-place process is referred to by those skilled in the art as a transfer process. The transfer process refers to a process in which sub-pixels formed on a growth substrate are arranged on a display substrate. When the conventional technique is performed, transfer of a red sub-pixel, transfer of a green sub-pixel, and transfer of a blue sub-pixel should be separately performed. That is, at least three transfer processes are required. However, in the present invention, three vertically stacked sub-pixels constitute one pixel, and thus only one transfer process is required. In addition, a defect can occur in an arrangement of the sub-pixels in the transfer process. When a defect occurs in an arrangement of the sub-pixels, a repair process in which only sub-pixels determined as defective are removed and replaced, is required. When a microdisplay is manufactured according to the conventional technique, the corresponding defective sub-pixel cannot singly be removed, and thus it is necessary to remove defective sub-pixels in units of blocks. However, it is not easy to select and remove red, green, and blue sub-pixels and replace the sub-pixels with a block having the same size at the same position. In the present invention, the area of the sub-pixel is the same as the area of the unit pixel, and therefore there is no need to selectively remove a sub-pixel. That is, there is an advantage in that only pixels determined as defective can be removed and new pixels can be easily arranged at the same position.

Further, compared to the case in which the sub-pixels are arranged horizontally, in the present invention, the sub-pixels are arranged vertically, and thus colors can be easily mixed and the display can be very easily implemented.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
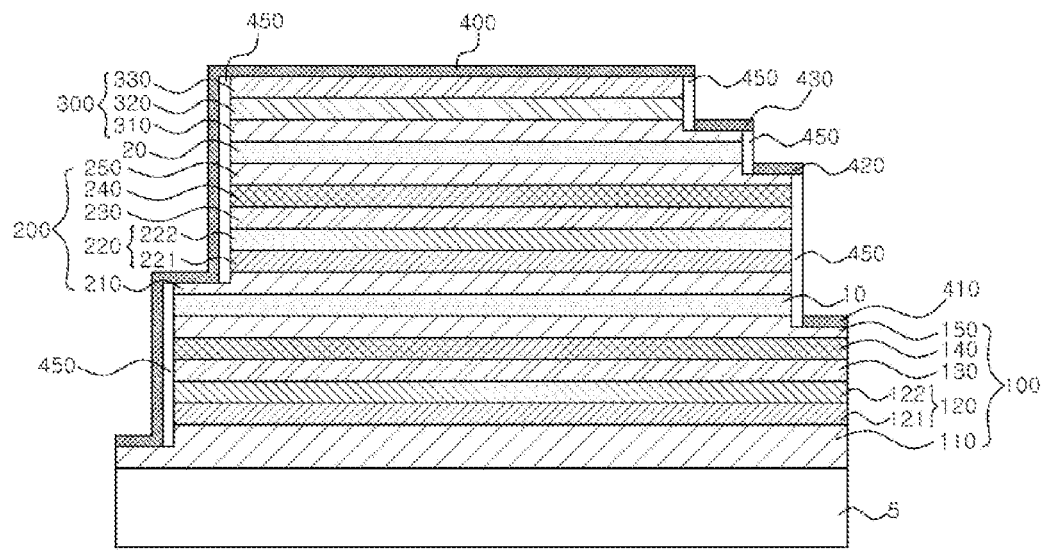
FIG. 1 is a cross-sectional view of a pixel of a microdisplay according to a first embodiment of the present invention.

While the present invention is susceptible to various modifications and alternative forms, specific embodiments thereof are shown by way of example in the drawings and will herein be described in detail. It should be understood, however, that there is no intent to limit the present invention to the particular forms disclosed, but on the contrary, the present invention is to cover all modifications, equivalents, and alternatives falling within the spirit and scope of the present invention. Like numbers refer to like elements throughout the description of the figures.

Unless otherwise defined, all terms (including technical and scientific terms) used herein have the same meaning as commonly understood by one of ordinary skill in the art to which this invention belongs. It should be further understood that terms, such as those defined in commonly used dictionaries, should be interpreted as having a meaning that is consistent with their meaning in the context of the relevant art and are not to be interpreted in an idealized or overly formal sense unless expressly so defined herein.

Hereinafter, exemplary embodiments of the present invention will be described in more detail with reference to the accompanying drawings.

First Embodiment

FIG. 1 is a cross-sectional view of a pixel of a microdisplay according to a first embodiment of the present invention.

Referring to FIG. 1, the pixel of the microdisplay includes a first sub-pixel 100, a first current blocking layer 10, a second sub-pixel 200, a second current blocking layer 20, and a third sub-pixel 300 which is formed on a growth substrate 5.

The first sub-pixel 100 is formed on the growth substrate 5 and forms light having a first wavelength. The growth substrate 5 is made of a material used in a typical light-emitting diode manufacturing process and, preferably, sapphire. The first current blocking layer 10 is formed on the first sub-pixel 100, and the second sub-pixel 200 is formed on the first current blocking layer 10. Due to the first current blocking layer 10, a first current flowing through the first sub-pixel 100 is blocked from being introduced into the second sub-pixel 200 and a second current flowing through the second sub-pixel 200 is also blocked from being introduced into the first sub-pixel 100. The second current blocking layer 20 is formed on the second sub-pixel 200 and the third sub-pixel 300 is formed on the second current blocking layer 20. A leakage current between the second sub-pixel 200 and the third sub-pixel 300 is blocked by the second current blocking layer 20.

The first sub-pixel 100 forms light having the first wavelength, and the second sub-pixel 200 forms light having a second wavelength longer than the first wavelength. Further, a third current flows through the third sub-pixel 300, and the third sub-pixel 300 forms light having a third wavelength longer than the second wavelength.

The first sub-pixel 100 includes a first contact n-type semiconductor layer 110, a first tunnel junction layer 120, a first p-type semiconductor layer 130, a first active layer 140, and a first n-type semiconductor layer 150 which is formed on the growth substrate 5. It is preferable that the first contact n-type semiconductor layer 110 and the first n-type semiconductor layer 150 be made of GaN and Si is used as a dopant. Further, the first p-type semiconductor layer 130 includes GaN, and it is preferable that Mg is used as a dopant. The first active layer 140 has a multi-quantum well structure and preferably emits blue light. Therefore, based on $In_xGa_{1-x}N$, the first active layer 140 of the first sub-pixel 100 may perform a light emission operation by adjusting the band gap according to a change in the mole fraction of In.

Further, the first tunnel junction layer 120 includes a first high-concentration n-type semiconductor layer 121 and a first high-concentration p-type semiconductor layer 122. The first high-concentration n-type semiconductor layer 121 is in contact with the first contact n-type semiconductor layer 110 and the first high-concentration p-type semiconductor layer 122 is in contact with the first p-type semiconductor layer 130. Since a common anode 400 is connected onto the first contact n-type semiconductor layer 110, the first tunnel junction layer 120 is in a reverse-biased state. Further, the first current supplied to the first sub-pixel 100 through the common anode may be evenly dispersed on a surface of the first active layer 140 by the first tunnel junction layer 120. Due to the current evenly dispersed on the surface of the first p-type semiconductor layer 130, the first active layer 140 may have high light emitting efficiency.

Further, the first n-type semiconductor layer 150 formed on the first active layer 140 has a higher conductivity than the first p-type semiconductor layer 130. Therefore, even when a first cathode 410 is connected to a portion of a surface of the first n-type semiconductor layer 150, the light emitting efficiency of the first active layer 140 is not reduced, and current crowding does not occur in the first active layer 140.

The first current blocking layer 10 is formed on the first sub-pixel 100. The first current blocking layer 10 blocks leakage current between the first sub-pixel 100 and the second sub-pixel 200. In order to block the current flowing between the semiconductor layers, the first current blocking layer 10 needs to have a high resistance or be reverse-biased with the semiconductor layers in contact therewith. For example, since the first current blocking layer 10 is in contact with the first n-type semiconductor layer 150 and the second contact n-type semiconductor layer 210, the first current blocking layer 10 may be set as a p-type semiconductor layer to form a reverse-biased junction in a vertical direction. Further, the first current blocking layer 10 may be formed of a GaN nonconductor containing a transition metal as a dopant, or $SiO_2$, which is an insulating material.

In the first current blocking layer 10, Mg-doped GaN or Mg-doped AlGaN may be used as a p-type semiconductor layer, and when the first current blocking layer 10 is made of an insulating layer, Fe-doped GaN or $SiO_2$ may be used as the first current blocking layer 10. When being doped with Fe, Fe atoms may also act as deep-level acceptors, and a very high value of resistance may be realized.

For example, in Fe-doped GaN, sheet resistance is 200 k$\Omega$/□ at a Fe concentration of $1.7\times10^{18}$ cm$^{-3}$, and sheet resistance is $7\times10^9$ k$\Omega$/□ at Fe concentration of $1.3\times10^{19}$ cm$^{-3}$. Therefore, it is preferable that a doping concentration of Fe in the first current blocking layer 10 be $1\times10^{19}$ cm$^{-3}$ or higher. The thickness of the first current blocking layer 10 is 100 nm or more and needs to be 1 μm or less. When the thickness of the first current blocking layer 10 is less than 100 nm, a sufficient sheet resistance value may not be obtained, and when the thickness of the first current blocking layer 10 is greater than 1 μm, productivity is reduced due to excessive layer growth time.

Further, a transition metal, such as Mn, Co, Ni, or Cu, in addition to Fe may be used as a dopant acting as a deep-level acceptor.

Further, in addition to the resistance value, the first current blocking layer 10 may have a p-type conductivity type and may be in contact with the second contact n-type semiconductor layer 210 of the second sub-pixel 200. A reverse-biased junction is formed between the second sub-pixel 200 and the first current blocking layer 10, and current flowing from the second sub-pixel 200 toward the first current blocking layer 10 is blocked by the reverse-biased junction.

The second sub-pixel 200 is disposed on the first current blocking layer 10. The second sub-pixel 200 includes a second contact n-type semiconductor layer 210, a second tunnel junction layer 220, a second p-type semiconductor layer 230, a second active layer 240, and a second n-type semiconductor layer 250. In order for the second active layer 240 forming light having the second wavelength to perform a light emission operation, the second current flows from the second contact n-type semiconductor layer 210 toward the second n-type semiconductor layer 250.

The second contact n-type semiconductor layer 210 is formed on the first current blocking layer 10. Further, the second tunnel junction layer 220 includes a second high-concentration n-type semiconductor layer 221 and a second high-concentration p-type semiconductor layer 222. The second contact n-type semiconductor layer 210 is in contact with the second high-concentration n-type semiconductor layer 221, and the second high-concentration p-type semiconductor layer 222 is formed on the second high-concentration n-type semiconductor layer 221. Therefore, in consideration of the direction of the current, the current may be evenly dispersed through the second contact n-type semiconductor layer 210 having a high conductivity. Therefore, the second p-type semiconductor layer 230 is formed on the second tunnel junction layer 220, and the second active layer 240 is formed on the second p-type semiconductor layer 230. In the second active layer 240, current crowding is prevented by the second tunnel junction layer 220, and the current is evenly dispersed over an entire surface of the second active layer 240.

The second current blocking layer 20 is formed on the second sub-pixel 200. The second current blocking layer 20 may be formed of a p-type semiconductor or an insulating layer. P-type GaN or p-type AlGaN is used as the p-type semiconductor, and Fe-doped GaN or $SiO_2$ is used as the insulating layer.

In particular, when the first current blocking layer 10 or the second current blocking layer 20 includes $SiO_2$, it is impossible to grow a high-quality compound semiconductor layer on the current blocking layer. Therefore, when $SiO_2$ is used as the current blocking layer, a process of bonding upper and lower sub-pixels to a wafer with $SiO_2$ as the bonding agent is required. Further, when the first current blocking layer 10 or the second current blocking layer 20 is made of a p-type semiconductor or Fe-doped GaN, it is possible to grow a compound semiconductor on the current blocking layer.

The third sub-pixel 300 is formed on the second current blocking layer 20. The third sub-pixel 300 includes a third n-type semiconductor layer 310, a third active layer 320, and a third p-type semiconductor layer 330.

The third n-type semiconductor layer 310 is formed on the second current blocking layer 20 and made of Si-doped GaN. In addition, the third n-type semiconductor layer 310 may be made of Si-doped AlInGaP. When the third n-type semiconductor layer 310 includes AlInGaP, the layer formed below the third n-type semiconductor layer 310 cannot be grown on the second current blocking layer 20 as a single-crystal of a III-nitride compound semiconductor. Therefore, when the third sub-pixel 300 includes AlInGaP, a process of bonding the third sub-pixel 300 onto the second current blocking layer 20 may be used. Further, when the third n-type semiconductor layer 310 includes GaN, the third n-type semiconductor layer 310 is easily grown using the second current blocking layer 20 formed below the third n-type semiconductor layer 310 as a base material for growth.

The third active layer 320 is formed on the third n-type semiconductor layer 310. The third active layer 320 forms light having a third wavelength longer than the second wavelength. For example, the third active layer 320 may form red light. Based on $In_xGa_{1-x}N$, the third active layer 320 may be formed using a technique in which the mole fraction of In is adjusted. When the third n-type semiconductor layer 310 includes AlInGaP, the third active layer 320 may be formed using the technique in which the mole fraction of In is adjusted.

The third p-type semiconductor layer 330 is formed on the third active layer 320. The third p-type semiconductor layer 330 supplies holes to the third active layer 320. To this end, the third p-type semiconductor layer 330 is doped with Mg.

The common anode 400 is formed on the third p-type semiconductor layer 330 and covers the third p-type semiconductor layer 330. The common anode 400 is made of a metal material and covers side surfaces of the first, second, and third sub-pixels 100, 200, and 300. However, when the common anode 400 covers the side surfaces of the sub-pixels 100, 200, and 300, the common anode 400 is electrically connected to other functional films, and thus an insulating layer 450 is interposed between the side surfaces of the first sub-pixel 100, the second sub-pixel 200, and the third sub-pixel 300 and the common anode 400.

Further, the common anode 400 is also formed on a partially exposed surface of the first contact n-type semiconductor layer 110 and is also formed on an exposed surface of the second contact n-type semiconductor layer 210. That is, the common anode 400 is electrically connected to the first contact n-type semiconductor layer 110, the second contact n-type semiconductor layer 210, and the third p-type semiconductor layer 330. It is known in the art that an anode is formed only on a portion or the entirety of a surface of a p-type semiconductor layer. However, in the present invention, in order to evenly supply the current to each of the sub-pixels and to supply a uniform current to each of the functional layers, the common anode 400 is connected to the n-type semiconductor layers having a high conductivity. Further, since the common anode 400 is formed on the entirety of the third p-type semiconductor layer 330, the current may also be evenly supplied to the third p-type semiconductor layer 330. Accordingly, the current is prevented from having localized current crowding effects in each of the active layers.

The first cathode 410 is formed on an exposed portion of the first n-type semiconductor layer 150, a second cathode 420 is formed on an exposed portion of the second n-type semiconductor layer 250, and a third cathode 430 is formed on an exposed portion of the third n-type semiconductor layer 310.

In the above-described structure, one common anode 400 and the first cathode 410, the second cathode 420, and the third cathode 430 are provided. When a voltage difference occurs between the common anode 400 and the first cathode 410, the second cathode 420, and the third cathode 430 which are separately formed, each of the first sub-pixel 100, the second sub-pixel 200, and the third sub-pixel 300 starts a light emission operation.

The first current flows from the first contact n-type semiconductor layer 110 toward the first n-type semiconductor layer 150, and light having a first wavelength is formed in the first active layer 140 according to the flowing first current. Further, the second current flows from the second contact n-type semiconductor layer 210 toward the second n-type semiconductor layer 250, and light having a second wavelength longer than the first wavelength is formed in the second active layer 240 according to the flowing second current. Interference between the first current and the second current is prevented by the first current blocking layer 10.

Further, the third current flows from the third p-type semiconductor layer 330 toward the third n-type semiconductor layer 310, and light having a third wavelength longer than the second wavelength is formed in the third active layer 320 according to the flowing third current. The second current and the third current act independently of each other due to the second current blocking layer 20.

The formed light having the first wavelength, the formed light having the second wavelength, and the formed light having the third wavelength may be directed toward the growth substrate 5 and may be directed in a direction opposite to the direction of the growth substrate 5. However, light traveling in the direction opposite to the direction of the growth substrate 5 is reflected by the common anode 400 formed on an entire surface of the third p-type semiconductor layer 330 and is directed toward the growth substrate 5. Therefore, the three types of lights formed are emitted toward the growth substrate 5. Accordingly, a specific color is realized.

Figure 2:
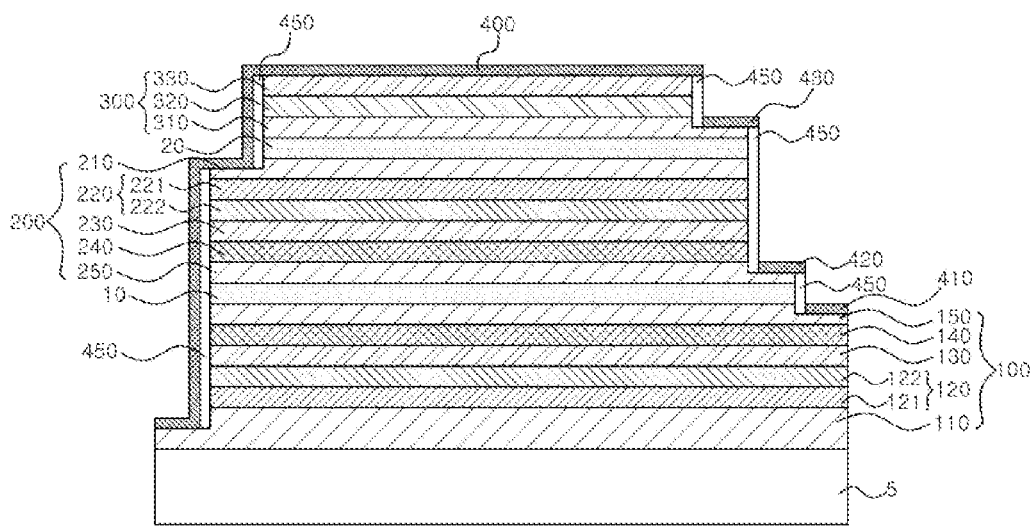
FIG. 2 is another cross-sectional view of the pixel of the microdisplay according to the first embodiment of the present invention.

FIG. 2 is another cross-sectional view of the pixel of the microdisplay according to the first embodiment of the present invention.

Referring to FIG. 2, a first sub-pixel 100, a first current blocking layer 10, a second sub-pixel 200, a second current blocking layer 20, and a third sub-pixel 300 are formed on a growth substrate 5.

The first sub-pixel 100, the first current blocking layer 10, the second current blocking layer 20, and the third sub-pixel 300 are the same as those described in FIG. 1. However, the arrangement and configuration of the second sub-pixel 200 are different from those described in FIG. 1. Therefore, the second sub-pixel 200 will be mainly described.

The second sub-pixel 200 includes a second n-type semiconductor layer 250, a second active layer 240, a second p-type semiconductor layer 230, a second tunnel junction layer 220, and a second contact n-type semiconductor layer 210.

The second n-type semiconductor layer 250 is formed on the first current blocking layer 10. Since the second n-type semiconductor layer 250 is made of GaN, the second n-type semiconductor layer 250 is easily grown on the first current blocking layer 10 made of GaN or AlGaN. Further, the second active layer 240 is formed on the second n-type semiconductor layer 250. The second active layer 240 forms light having a second wavelength longer than a first wavelength by adjusting the mole fraction of In in $In_xGa_{1-x}N$.

The second p-type semiconductor layer 230 is formed on the second active layer 240. The second p-type semiconductor layer 230 includes a GaN compound semiconductor and is preferably doped with Mg. The second p-type semiconductor layer 230 has a lower conductivity than the second n-type semiconductor layer 250.

The second tunnel junction layer 220 is formed on the second p-type semiconductor layer 230. The second tunnel junction layer 220 includes a second high-concentration p-type semiconductor layer 222 and a second high-concentration n-type semiconductor layer 221. A current introduced into the second contact n-type semiconductor layer 210 may be evenly dispersed by the second tunnel junction layer 220. The second high-concentration p-type semiconductor layer 222 is formed on the second p-type semiconductor layer 230, and the second high-concentration n-type semiconductor layer 221 is formed on the second high-concentration p-type semiconductor layer 222. Further, the second contact n-type semiconductor layer 210 is formed on the second high-concentration n-type semiconductor layer 221. When a second current is supplied from the second contact n-type semiconductor layer 210 and flows through the second tunnel junction layer 220, the second tunnel junction layer 220 is in a reverse-biased state due to the direction of the second current, and, accordingly, the second current is evenly dispersed on all layers due to the second contact n-type semiconductor layer 210 having a high conductivity.

In the structure of the pixel of FIG. 2, a common anode 400 is commonly connected to the first contact n-type semiconductor layer 110, the second contact n-type semiconductor layer 210, and the third p-type semiconductor layer 330. In particular, the common anode 400 is formed on an entire surface of the third p-type semiconductor layer 330. Further, a first cathode 410 is formed on the first n-type semiconductor layer 150, a second cathode 420 is formed on the second n-type semiconductor layer 250, and a third cathode 430 is formed on the third n-type semiconductor layer 310. During a light emission operation or a display operation, currents flow from the common anode 400 toward the first cathode 410, the second cathode 420, and the third cathode 430.

The first current blocking layer 10 prevents a leakage current from occurring between a first current flowing through the first sub-pixel 100 and a second current flowing through the second sub-pixel 200. The second current blocking layer 20 prevents a leakage current from occurring between the second current and a third current flowing through the third sub-pixel 300. Accordingly, the first, second, and third currents may independently flow through the first sub-pixel 100, the second sub-pixel 200, and the third sub-pixel 300, respectively. The light emission operations of the first sub-pixel 100, the second sub-pixel 200, and the third sub-pixel 300 may be independently controlled by the first, second, and third currents independently flowing.

Further, light formed from each of the active layers including the first active layer 140, the second active layer 240, and the third active layer 320 is directed in the direction of the growth substrate 5 by the common anode 400 which is made of a metal material and formed on the third p-type semiconductor layer 330.

In the present embodiment, the current blocking layers are interposed between the three sub-pixels which are vertically stacked on the growth substrate. Further, the currents are introduced from one common anode and flow toward three cathodes. Accordingly, the sub-pixels may be controlled individually by the currents. The common anode may connect the pixels to each other, which are formed in the same structure on the substrate, through a first n-type contact layer to allow a common voltage to be equally applied to the sub-pixels.

Second Embodiment

Figure 3:
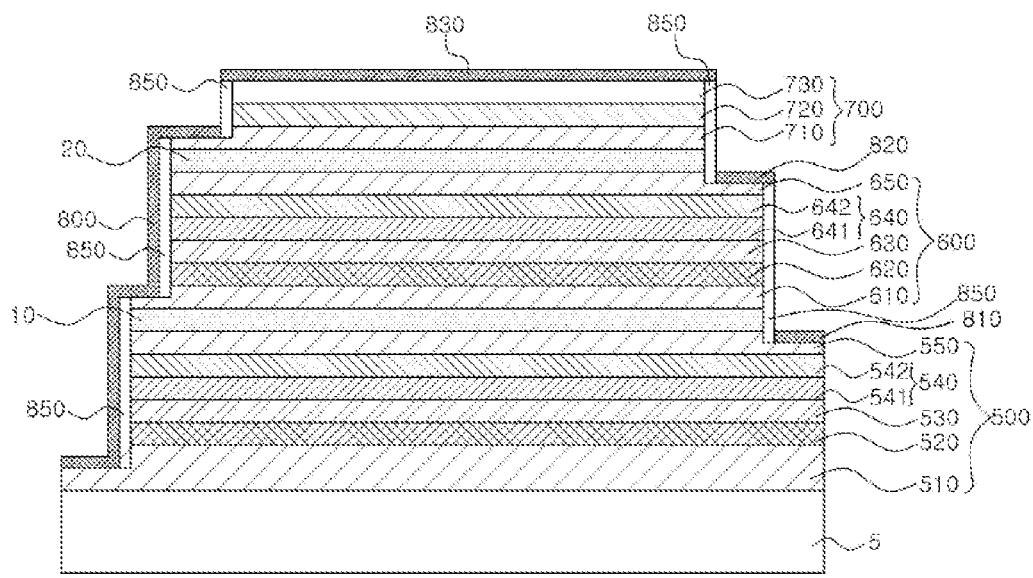
FIG. 3 is a cross-sectional view of a pixel of a microdisplay according to a second embodiment of the present invention.

FIG. 3 is a cross-sectional view of a pixel of a microdisplay according to a second embodiment of the present invention.

Referring to FIG. 3, the pixel of the microdisplay includes a first sub-pixel 500, a first current blocking layer 10, a second sub-pixel 600, a second current blocking layer 20, and a third sub-pixel 700.

The first sub-pixel 500 is formed on a growth substrate 5 and forms light having a first wavelength by a first current that flows therethrough. The second sub-pixel 600 is formed on the first current blocking layer 10 formed on the first sub-pixel 500 and forms light having a second wavelength longer than the first wavelength due to a second current. The first current and the second current act independently of each other due to the first current blocking layer 10.

The second current blocking layer 20 is formed on the second sub-pixel 600 and the third sub-pixel 700 is formed on the second current blocking layer 20. The third sub-pixel 700 forms light having a third wavelength longer than the second wavelength due to a third current flowing through the third sub-pixel 700. The second current and the third current act independently of each other due to the second current blocking layer 20 interposed between the second sub-pixel 600 and the third sub-pixel 700.

Further, a common cathode 800 is commonly connected to the first sub-pixel 500, the second sub-pixel 600, and the third sub-pixel 700. A first anode 810 is connected to the first sub-pixel 500 and a second anode 820 is connected to the second sub-pixel 600. In addition, a third anode 830 is connected to the third sub-pixel 700. The currents flow from the first anode 810, the second anode 820, and the third anode 830 toward the common cathode 800 for a display operation. The three types of lights formed are mixed, and a specific color is realized.

The first sub-pixel 500 includes a first n-type semiconductor layer 510, a first active layer 520, a first p-type semiconductor layer 530, a first tunnel junction layer 540, and a first contact n-type semiconductor layer 550.

The first n-type semiconductor layer 510 includes GaN and is preferably doped with Si. It is preferable that the first n-type semiconductor layer 510 be formed on sapphire, which is a growth substrate 5. The common cathode 800 is connected to a partial region of the first n-type semiconductor layer 510. The first active layer 520 is formed on the first n-type semiconductor layer 510. The first active layer 520 forms light having a first wavelength and, preferably, blue light. Further, the first p-type semiconductor layer 530 is formed on the first active layer 520. It is preferable that the first p-type semiconductor layer 530 be made of Mg-doped GaN. Holes supplied from the first p-type semiconductor layer 530 and electrons supplied from the first n-type semiconductor layer 510 are introduced into the first active layer 520, and a light emission operation is performed by a quantum confinement effect and recombination.

The first tunnel junction layer 540 is formed on the first p-type semiconductor layer 530. The first tunnel junction layer 540 includes a first high-concentration p-type semiconductor layer 541 and a first high-concentration n-type semiconductor layer 542. During the light emission operation, the first current flows from the first high-concentration n-type semiconductor layer 542 toward the first high-concentration p-type semiconductor layer 541. Therefore, the first tunnel junction layer 540 is in a reverse-biased state.

The first contact n-type semiconductor layer 550 is formed on the first high-concentration n-type semiconductor layer 542. The first contact n-type semiconductor layer 550 is electrically connected to the first anode 810. Therefore, a positive voltage is applied to the first contact n-type semiconductor layer 550. Since the first contact n-type semiconductor layer 550 has a higher conductivity than the first p-type semiconductor layer 530 and the first high-concentration n-type semiconductor layer 542 also has a high conductivity, the first current supplied from the first anode 810 may be evenly dispersed on a surface of the first active layer 520.

The first current blocking layer 10 is formed on the first contact n-type semiconductor layer 550. The first current blocking layer 10 may be made of a P-type semiconductor or an insulating material. When the first current blocking layer 10 is made of a p-type semiconductor, the first current blocking layer 10 may be made of Mg-doped GaN or Mg-doped AlGaN. Further, when the first current blocking layer 10 is made of an insulating material, the first current blocking layer 10 may be made of Fe-doped GaN or $SiO_2$. Except for $SiO_2$, the first current blocking layer 10 is easily grown on the first contact n-type semiconductor layer 550 using a epitaxial growth method. When the first current blocking layer 10 is made of $SiO_2$, the first sub-pixel 500 and the second sub-pixel 600 face each other with the first current blocking layer 10 interposed therebetween. Due to a voltage applied to the first anode 810, the first contact n-type semiconductor layer 550 and the p-type first current blocking layer 10 are in a reverse-biased state. Therefore, a leakage current from the first sub-pixel 500 to the second sub-pixel 600 is blocked.

The second sub-pixel 600 is formed on the first current blocking layer 10. The second sub-pixel 600 includes a second n-type semiconductor layer 610, a second active layer 620, a second p-type semiconductor layer 630, a second tunnel junction layer 640, and a second contact n-type semiconductor layer 650.

The second n-type semiconductor layer 610 is electrically connected to the common cathode 800, and the second contact n-type semiconductor layer 650 is electrically connected to the second anode 820. Therefore, the second current flows from the second contact n-type semiconductor layer 650 toward the second n-type semiconductor layer 610, and the second active layer 620 forms light having the second wavelength longer than the first wavelength.

It is preferable that the second n-type semiconductor layer 610 be made of Si-doped GaN, and the second n-type semiconductor layer 610 is formed on the first current blocking layer 10 through compound semiconductor growth. Further, the second active layer 620 is formed on the second n-type semiconductor layer 610, and it is preferable that the second active layer 620 form green light by adjusting the mole fraction of In in $In_xGa_{1-x}N$. The second p-type semiconductor layer 630 is formed on the second active layer 620. Holes supplied from the second p-type semiconductor layer 630 and electrons supplied from the second n-type semiconductor layer 610 are recombined in the second active layer 620 so that a light emission operation is performed.

The second tunnel junction layer 640 is formed on the second p-type semiconductor layer 630, and the second tunnel junction layer 640 includes a second high-concentration p-type semiconductor layer 641 and a second high-concentration n-type semiconductor layer 642. Further, the second contact n-type semiconductor layer 650 is formed on the second high-concentration n-type semiconductor layer 642. The second contact n-type semiconductor layer 650 is electrically connected to the second anode 820 to receive the second current. The second current flows through the second tunnel junction layer 640 which is in a reverse-biased state. Since the second contact n-type semiconductor layer 650 and the second high-concentration n-type semiconductor layer 642 each have a higher conductivity than a general p-type semiconductor layer, the supplied second current may be evenly dispersed on the second active layer 620. Further, a phenomenon in which the second current supplied to the second contact n-type semiconductor layer 650 leaks to the third sub-pixel 300 is prevented by the second current blocking layer 20.

The second current blocking layer 20 is formed on the second contact n-type semiconductor layer 650. The second current blocking layer 20 is formed of a p-type semiconductor or an insulating material.

The third sub-pixel 700 is disposed on the second current blocking layer 20. The third sub-pixel 700 includes a third n-type semiconductor layer 710, a third active layer 720, and a third p-type semiconductor layer 730. The third n-type semiconductor layer 710 is electrically connected to the common cathode 800, and the third p-type semiconductor layer 730 is electrically connected to the third anode 830. The third current supplied through the third anode 830 flows to the common cathode 800. The third active layer 720 forms light having a third wavelength. To this end, the third sub-pixel 700 may be made of a GaN-based compound semiconductor or may be made of an AlInGaP-based compound semiconductor.

When the third sub-pixel 700 includes a GaN compound semiconductor, the third sub-pixel 700 may be formed on the second current blocking layer 20 by a growth method using a metalorganic chemical vapor deposition (MOCVD) process. Further, when the third sub-pixel 700 includes an AlInGaP compound semiconductor, the third sub-pixel 700 may be formed on the second current blocking layer 20 through a bonding process.

The common cathode 800 is commonly connected to the first n-type semiconductor layer 510, the second n-type semiconductor layer 610, and the third n-type semiconductor layer 710. The common cathode 800 is formed on partially exposed regions of the first n-type semiconductor layer 510, the second n-type semiconductor layer 610, and the third n-type semiconductor layer 710 and is formed along side surfaces of the first sub-pixel 500, the second sub-pixel 600, and the third sub-pixel 700. However, in order to avoid coming into contact with functional layers constituting the first sub-pixel 500, the second sub-pixel 600, and the third sub-pixel 700, an insulating layer 850 needs to be formed between the side surfaces of the sub-pixels and the common cathode 800.

The first anode 810 is formed on the first contact n-type semiconductor layer 550, and the second anode 820 is formed on the second contact n-type semiconductor layer 650. Further, the third anode 830 is formed on the third p-type semiconductor layer 730 and covers the third p-type semiconductor layer 730. The anodes 810, 820, and 830 are formed to be separated from each other. The light formed from each of the active layers is reflected by the third anode 830, which is formed over an entire surface of the third p-type semiconductor layer 730, toward the growth substrate 5. Therefore, the formed light is directed in the direction of the growth substrate 5. Further, when the first current, the second current, and the third current are supplied through the first anode 810, the second anode 820, and the third anode 830 which are separated from each other, the light emission operation is performed in the first active layer 520, the second active layer 620, and the third active layer 720, and all the currents flow through the common cathode 800.

Through the above-described mechanism, the light emission operation is performed by the first to third currents flowing through the first active layer 520, the second active layer 620, and the third active layer 720, respectively, and the formed lights are mixed and a specific color is realized.

Figure 4:
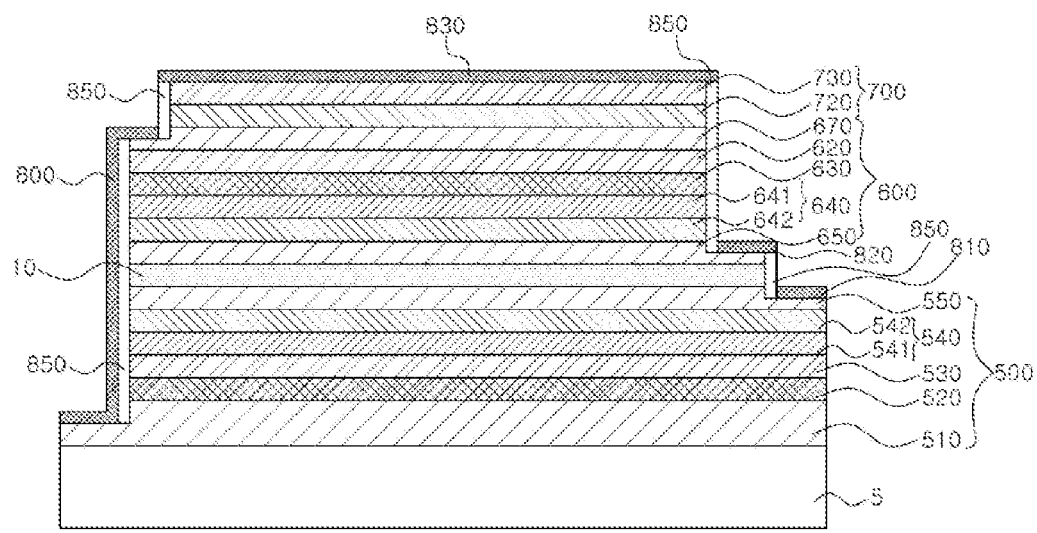
FIG. 4 is another cross-sectional view of the pixel of the microdisplay according to the second embodiment of the present invention.

FIG. 4 is another cross-sectional view of the pixel of the microdisplay according to the second embodiment of the present invention.

Referring to FIG. 4, a first sub-pixel 500 and a first current blocking layer 10 are the same as those described in FIG. 3. In FIG. 4, a configuration of a second sub-pixel 600 is different, a second current blocking layer is excluded, and a configuration of a third sub-pixel 700 is different as compared to those described in FIG. 3. Therefore, the components different from those of FIG. 3 will be described.

A second sub-pixel 600 formed on a first current blocking layer 10 includes a second contact n-type semiconductor layer 650, a second tunnel junction layer 640, a second p-type semiconductor layer 630, a second active layer 620, and a common N-type semiconductor layer 670.

When the first current blocking layer 10 is made of a p-type semiconductor or Fe-doped GaN, the second contact n-type semiconductor layer 650 may be easily grown. Further, when the first current blocking layer 10 is made of $SiO_2$ or the like, the second sub-pixel 600 may be formed on the first current blocking layer 10 through a bonding process. The second contact n-type semiconductor layer 650 is electrically connected to a second anode 820.

The second tunnel junction layer 640 includes a second high-concentration n-type semiconductor layer 642 and a second high-concentration p-type semiconductor layer 641. The second high-concentration n-type semiconductor layer 642 is formed on the second contact n-type semiconductor layer 650 and the second high-concentration p-type semiconductor layer 641 is formed on the second high-concentration n-type semiconductor layer 642. Further, the second p-type semiconductor layer 630 is formed on the second tunnel junction layer 640 and the second active layer 620 is formed on the second p-type semiconductor layer 630.

The second sub-pixel 600 shares an n-type semiconductor layer with the third sub-pixel 700. That is, the common n-type semiconductor layer 670 supplies electrons to the second sub-pixel 600 and the third sub-pixel 700 and is commonly used.

When a current is supplied through the second anode 820 formed on the second contact n-type semiconductor layer 650, the current may be evenly dispersed by the second contact n-type semiconductor layer 650 and the second high-concentration n-type semiconductor layer 642, each having a high conductivity, and light having a second wavelength may be formed in the second active layer 620. A second current flows along the common n-type semiconductor layer 670 to a common cathode 800.

The common cathode 800 is formed on the common n-type semiconductor layer 670, and the second current and a third current flow through the common n-type semiconductor layer 670.

The third sub-pixel 700 includes the common n-type semiconductor layer 670, a third active layer 720, and a third p-type semiconductor layer 730. It is preferable that the third active layer 720 and the third p-type semiconductor layer 730 be made of a GaN-based compound semiconductor, and it is preferable that the third active layer 720 form red light by adjusting the mole fraction of In. The third sub-pixel 700 may be formed through a MOCVD process by using the common n-type semiconductor layer 670 as a base material for growth.

As illustrated in FIG. 4, the pixel of the microdisplay includes one common cathode 800 and the first anode 810, the second anode 820, and the third anode 830. The first current is supplied through the first anode 810, the second current is supplied through the second anode 820, and the third current is supplied through the third anode 830. The three types of currents are combined at the common cathode 800. However, currents are independently supplied to the first active layer 520, the second active layer 620, and the third active layer 720 so that light having an intensity corresponding to the applied current is formed in each. The three types of currents are mixed and a specific color is realized. Further, the third anode 830 covers the entirety of the third p-type semiconductor layer 730. Therefore, the lights traveling in a direction opposite to a direction of a growth substrate 5 are reflected by the third anode 830, and the formed lights are emitted toward the growth substrate 5.

Figure 5:
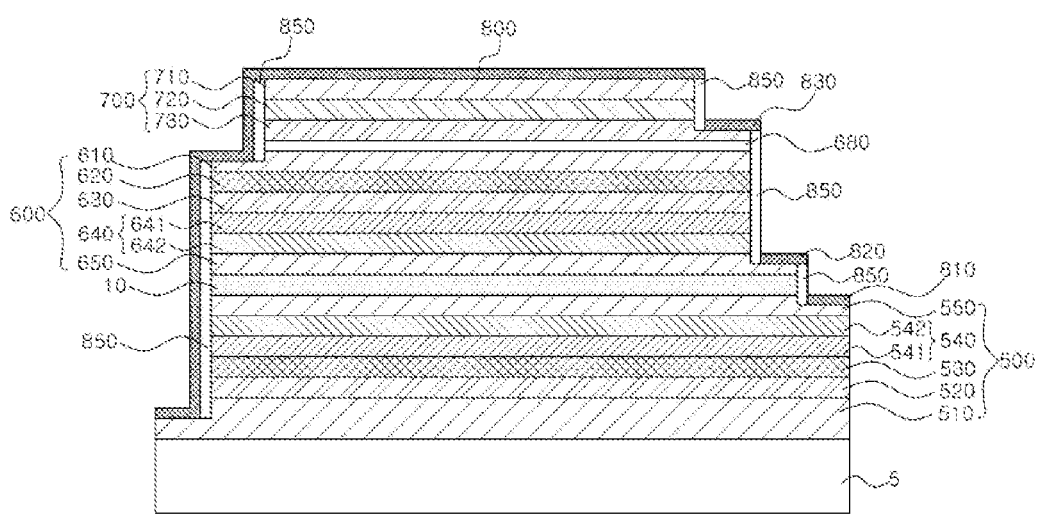
FIG. 5 is still another cross-sectional view of the pixel of the microdisplay according to the second embodiment of the present invention.

FIG. 5 is still another cross-sectional view of the pixel of the micro display according to the second embodiment of the present invention.

Referring to FIG. 5, a first sub-pixel 500, a first current blocking layer 10, and a second sub-pixel 600 are the same as those described in FIG. 4. However, in the second sub-pixel 600, a second n-type semiconductor layer 610 is formed on a second active layer 620.

Further, a bonding layer 680 is formed on the second sub-pixel 600 and a third sub-pixel 700 is formed on the bonding layer 680. The third sub-pixel 700 is grown on a separate substrate rather than a growth substrate 5 on which the first sub-pixel 500 and the second sub-pixel 600 are formed. For example, the third sub-pixel 700 is formed on a GaAs substrate and bonded to the second sub-pixel 600 with the bonding layer 680. Further, the GaAs substrate used for growth of the third sub-pixel 700 may be easily removed by an acid solution or the like. It is preferable that the bonding layer 680 be made of any light-transmitting material, but the bonding layer 680 is more preferably made of a polymer material having adhesiveness.

The third sub-pixel 700 includes a third p-type semiconductor layer 730, a third active layer 720, and a third n-type semiconductor layer 710. The third P-type semiconductor layer 730 is made of AlInGaP and Mg is used as a dopant. Further, it is preferable that the third active layer 720 be made of AlInGaP and have a quantum well structure by adjusting the mole fraction of In. The third n-type semiconductor layer 710 is also made of AlInGaP and Si is used as a dopant.

A third anode 830 is formed on a portion of a surface of the third p-type semiconductor layer 730, and a common cathode 800 is formed on the third n-type semiconductor layer 710 and covers the third n-type semiconductor layer 710. In order to prevent the common cathode 800 from being connected to side surfaces of functional films of the first sub-pixel 500, the second sub-pixel 600, and the third sub-pixel 700, an insulating layer 850 is interposed between the common cathode 800 and the side surfaces of the first sub-pixel 500, the second sub-pixel 600, and the third sub-pixel 700.

The common cathode 800 is formed on an entire surface of the third n-type semiconductor layer 710, a portion of a surface of the second n-type semiconductor layer 610, and a portion of a surface of the first n-type semiconductor layer 510. Further, a first anode 810 is formed on a portion of a surface of the first contact n-type semiconductor layer 550, and a second anode 820 is formed on a portion of a surface of the second contact n-type semiconductor layer 650. Further, the third anode 830 is formed on a portion of the surface of the third p-type semiconductor layer 730.

A first current is supplied to the first sub-pixel 500 through the first anode 810, and a second current is supplied to the second sub-pixel 600 through the second anode 820. A leakage current between the first sub-pixel 500 and the second sub-pixel 600 is blocked by the first current blocking layer 10. Therefore, the first active layer 520 and the second active layer 620 perform a light emission operation with luminance corresponding to the first current and the second current, respectively. Further, a third current is supplied through the third anode 830, and the third active layer 720 forms light having a third wavelength corresponding to the third current. The formed lights are reflected by the common cathode 800 and emitted toward the growth substrate 5.

In the present embodiment, the three sub-pixels forming lights having different wavelengths are stacked in a direction perpendicular to the growth substrate. Further, one common cathode is formed on the sub-pixels. Further, an anode is formed in each of the sub-pixels, and currents are applied through the anodes. In each of the sub-pixels, the light emission operation is performed by the currents independently supplied to each, and the formed lights in the respective sub-pixels are mixed and a specific color is realized.

In the present invention, sub-pixels forming lights having different wavelengths are vertically formed on a growth substrate. Therefore, the area of a pixel of a microdisplay can be reduced. That is, compared to one pixel conventionally formed by a combination of conventional red, green, and blue sub-pixels arranged horizontally on a display substrate, the overall area of a unit pixel can be significantly reduced.

Further, in order to manufacture a microdisplay, a pick-and-place process is required. The pick-and-place process is referred to by those skilled in the art as a transfer process. The transfer process refers to a process in which sub-pixels formed on a growth substrate are arranged on a display substrate. When the conventional technique is performed, transfer of a red sub-pixel, transfer of a green sub-pixel, and transfer of a blue sub-pixel should be separately performed. That is, at least three transfer processes are required. However, in the present invention, three vertically stacked sub-pixels constitute one pixel, and thus only one transfer process is required. In addition, a defect can occur in an arrangement of the sub-pixels in the transfer process. When a defect occurs in an arrangement of the sub-pixels, a repair process in which only sub-pixels determined as defective are removed and replaced is required. When a microdisplay is manufactured according to the conventional technique, the corresponding defective sub-pixel cannot singly be selectively removed, and thus it is necessary to remove defective sub-pixels in units of blocks. However, it is not easy to select and remove red, green, and blue sub-pixels and replace the sub-pixels with a block having the same size at the same position. In the present invention, the area of the sub-pixel is the same as the area of the unit pixel, and there is no need to selectively remove the sub-pixel. That is, there is an advantage in that only pixels determined as defective in arrangement can be removed and new pixels can be easily arranged in the same position.

Further, compared to the case in which the sub-pixels are arranged horizontally, in the present invention, the sub-pixels are arranged vertically, and thus colors can be easily mixed and the display can be very easily implemented.

What is claimed is:

1. A unit pixel of a microdisplay, the unit pixel comprising:
    a first sub-pixel formed on a growth substrate and configured to form light having a first wavelength according to a first current;
    a first current blocking layer formed on the first sub-pixel and configured to block a leakage current directed toward the first sub-pixel or introduced from the first sub-pixel;
    a second sub-pixel formed on the first current blocking layer and configured to form light having a second wavelength longer than the first wavelength according to a second current;
    a second current blocking layer formed on the second sub-pixel and configured to block a leakage current directed toward the second sub-pixel or introduced from the second sub-pixel; and
    a third sub-pixel formed on the second current blocking layer and configured to form light having a third wavelength longer than the second wavelength according to a third current,
    wherein a common anode is commonly connected to the first sub-pixel, the second sub-pixel, and the third sub-pixel, a first cathode is connected to the first sub-pixel, a second cathode is connected to the second sub-pixel, and a third cathode is connected to the third sub-pixel.

2. The unit pixel of claim 1, wherein the first current blocking layer is made of a p-type semiconductor or an insulating material.

3. The unit pixel of claim 2, wherein the first current blocking layer includes p-type GaN, p-type AlGaN, Mg-doped GaN, or $SiO_2$.

4. The unit pixel of claim 1, wherein the second current blocking layer is made of a p-type semiconductor or an insulating material.

5. The unit pixel of claim 4, wherein the second current blocking layer includes p-type GaN, p-type AlGaN, Mg-doped GaN, or $SiO_2$.

6. The unit pixel of claim 1, wherein the first sub-pixel includes:
   a first contact n-type semiconductor layer formed on the growth substrate;
   a first tunnel junction layer formed on the first contact n-type semiconductor layer;
   a first p-type semiconductor layer formed on the first tunnel junction layer;
   a first active layer formed on the first p-type semiconductor layer and configured to form the light having the first wavelength; and
   a first n-type semiconductor layer formed on the first active layer,
   wherein the common anode is formed on the first contact n-type semiconductor layer and the first cathode is formed on the first n-type semiconductor layer.

7. The unit pixel of claim 6, wherein the first tunnel junction layer includes:
   a first high-concentration n-type semiconductor layer formed on the first contact n-type semiconductor layer; and
   a first high-concentration p-type semiconductor layer formed on the first high-concentration n-type semiconductor layer,
   wherein, in the direction of the first current flowing during a light emission operation of the first sub-pixel, the first tunnel junction layer is in a reverse-biased state.

8. The unit pixel of claim 6, wherein the first n-type semiconductor layer forms a p-n junction with the first current blocking layer, wherein the first n-type semiconductor layer and the first current blocking layer forms a reverse-biased junction in the direction of the first current.

9. The unit pixel of claim 1, wherein the second sub-pixel includes:
   a second contact n-type semiconductor layer formed on the first current blocking layer;
   a second tunnel junction layer formed on the second contact n-type semiconductor layer;
   a second p-type semiconductor layer formed on the second tunnel junction layer;
   a second active layer formed on the second p-type semiconductor layer and configured to form the light having the second wavelength; and
   a second n-type semiconductor layer formed on the second active layer,
   wherein the common anode is formed on the second contact n-type semiconductor layer and the second cathode is formed on the second n-type semiconductor layer.

10. The unit pixel of claim 9, wherein the second tunnel junction layer includes:
    a second high-concentration n-type semiconductor layer formed on the second contact n-type semiconductor layer; and
    a second high-concentration p-type semiconductor layer formed on the second high-concentration n-type semiconductor layer,
    wherein, in the direction of the second current flowing during a light emission operation of the second sub-pixel, the second tunnel junction layer is in a reverse-biased state.

11. The unit pixel of claim 9, wherein:
    the second n-type semiconductor layer forms a p-n junction with the second current blocking layer, wherein the second n-type semiconductor layer and the second current blocking layer forms a reverse-biased junction in the direction of the second current; and
    the second contact n-type semiconductor layer and the first current blocking layer forms a reverse-biased junction in the direction of the second current.

12. The unit pixel of claim 1, wherein the third sub-pixel includes:
    a third n-type semiconductor layer formed on the second current blocking layer;
    a third active layer formed on the third n-type semiconductor layer; and
    a third p-type semiconductor layer formed on the third active layer,
    wherein the common anode covers the third p-type semiconductor layer and the third cathode is formed on the third n-type semiconductor layer.

13. The unit pixel of claim 12, wherein the third n-type semiconductor layer forms a p-n junction with the second current blocking layer, wherein the third n-type semiconductor layer and the second current blocking layer forms a reverse-biased junction in the direction of the third current.

14. The unit pixel of claim 1, wherein the second sub-pixel includes:
    a first n-type semiconductor layer formed on the first current blocking layer;
    a second active layer formed on the first n-type semiconductor layer;
    a second p-type semiconductor layer formed on the second active layer;
    a second tunnel junction layer formed on the second p-type semiconductor layer; and
    a second contact n-type semiconductor layer formed on the second tunnel junction layer,
    wherein the common anode is formed on the second contact n-type semiconductor layer and the second cathode is formed on the second n-type semiconductor layer.

15. The unit pixel of claim 14, wherein:
    the second n-type semiconductor layer forms a p-n junction with the first current blocking layer, wherein the second n-type semiconductor layer and the first current blocking layer forms a reverse-biased junction in a direction of the second current; and
    the second contact n-type semiconductor layer and the second current blocking layer forms a reverse-biased junction in the direction of the second current.

16. A unit pixel of a microdisplay, the unit pixel comprising:
    a first sub-pixel formed on a growth substrate and configured to form light having a first wavelength according to a first current;

a first current blocking layer formed on the first sub-pixel and configured to block a leakage current directed toward the first sub-pixel or introduced from the first sub-pixel;

a second sub-pixel formed on the first current blocking layer and configured to form light having a second wavelength longer than the first wavelength according to a second current; and a third sub-pixel formed on the second sub-pixel and configured to form light having a third wavelength longer than the second wavelength according to a third current, wherein a common cathode is commonly connected to the first sub-pixel, the second sub-pixel, and the third sub-pixel, a first anode is connected to the first sub-pixel, a second anode is connected to the second sub-pixel, and a third anode is connected to the third sub-pixel.

17. The unit pixel of claim 16, wherein the first sub-pixel includes:
a first n-type semiconductor layer formed on the growth substrate;
a first active layer formed on the first n-type semiconductor layer;
a first p-type semiconductor layer formed on the first active layer;
a first tunnel junction layer formed on the first p-type semiconductor layer; and
a first contact n-type semiconductor layer formed on the first tunnel junction layer,
wherein the common cathode is formed on the first n-type semiconductor layer and the first anode is formed on the first contact n-type semiconductor layer.

18. The unit pixel of claim 16, wherein, in order to block a leakage current between the second current and the third current, a second current blocking layer made of p-type GaN, P-type AlGaN, Mg-doped GaN, or $SiO_2$ is further included between the second sub-pixel and the third sub-pixel.

19. The unit pixel of claim 18, wherein the second sub-pixel includes:
a second n-type semiconductor layer formed on the first current blocking layer;
a second active layer formed on the second n-type semiconductor layer;
a second P-type semiconductor layer formed on the second active layer;
a second tunnel junction layer formed on the second p-type semiconductor layer; and
a second contact n-type semiconductor layer formed on the second tunnel junction layer,
wherein the common cathode is formed on the second n-type semiconductor layer and the second anode is formed on the second contact n-type semiconductor layer.

20. The unit pixel of claim 18, wherein the third sub-pixel includes:
a third n-type semiconductor layer formed on the second current blocking layer;
a third active layer formed on the third n-type semiconductor layer; and
a third P-type semiconductor layer formed on the third active layer,
wherein the common cathode is formed on the third n-type semiconductor layer and the third anode covers the third p-type semiconductor layer.

21. The unit pixel of claim 16, wherein the second sub-pixel and the third sub-pixel share a common n-type semiconductor layer,
the second sub-pixel includes:
a second contact n-type semiconductor layer formed on the first current blocking layer;
a second tunnel junction layer formed on the second contact n-type semiconductor layer;
a second p-type semiconductor layer formed on the second tunnel junction layer;
a second active layer formed on the second p-type semiconductor layer; and
the common n-type semiconductor layer formed on the second active layer, and
the third sub-pixel includes:
the common n-type semiconductor layer formed on the second active layer;
a third active layer formed on the common n-type semiconductor layer; and
a third p-type semiconductor layer formed on the third active layer,
wherein the common cathode is formed on the common n-type semiconductor layer, the second anode is formed on the second contact n-type semiconductor layer, and the third anode is formed while covering the third p-type semiconductor layer.

22. The unit pixel of claim 16, wherein a bonding layer is further included between the second sub-pixel and the third sub-pixel.

23. The unit pixel of claim 22, wherein the third sub-pixel includes:
a third p-type semiconductor layer formed on the bonding layer;
a third active layer formed on the third p-type semiconductor layer; and
a third n-type semiconductor layer formed on the third active layer,
wherein the common cathode covers the third n-type semiconductor layer and the third anode is formed on the third p-type semiconductor layer.

24. The unit pixel of claim 23, wherein the third active layer includes AlInGaP.

* * * * *